United States Patent
Kurita et al.

(10) Patent No.: US 12,519,018 B2
(45) Date of Patent: Jan. 6, 2026

(54) WORKPIECE CUTTING METHOD AND RESIN APPLYING DEVICE

(71) Applicants: Kyoritsu Chemical & Co., Ltd., Tokyo (JP); HAMAMATSU PHOTONICS K.K., Hamamatsu (JP)

(72) Inventors: Daisuke Kurita, Tokyo (JP); Yasunobu Matsumoto, Tokyo (JP); Takeshi Sakamoto, Hamamatsu (JP); Iku Sano, Hamamatsu (JP)

(73) Assignees: Kyoritsu Chemical & Co., Ltd., Tokyo (JP); HAMAMATSU PHOTONICS K.K., Hamamatsu (JP)

( * ) Notice: Subject to any disclaimer, the term of this patent is extended or adjusted under 35 U.S.C. 154(b) by 537 days.

(21) Appl. No.: 17/799,389

(22) PCT Filed: Feb. 5, 2021

(86) PCT No.: PCT/JP2021/004395
§ 371 (c)(1),
(2) Date: Aug. 12, 2022

(87) PCT Pub. No.: WO2021/166696
PCT Pub. Date: Aug. 26, 2021

(65) Prior Publication Data
US 2023/0343646 A1    Oct. 26, 2023

(30) Foreign Application Priority Data
Feb. 20, 2020  (JP) .................................. 2020-027260

(51) Int. Cl.
*H01L 21/78*   (2006.01)
*H01L 21/268*  (2006.01)
(Continued)

(52) U.S. Cl.
CPC ............ *H01L 21/78* (2013.01); *H01L 21/268* (2013.01); *H01L 21/56* (2013.01); *H01L 21/6715* (2013.01); *H01L 21/6836* (2013.01)

(58) Field of Classification Search
CPC . H01L 21/02076; H01L 21/268; H01L 21/56; H01L 21/67092; H01L 21/67115;
(Continued)

(56) References Cited

U.S. PATENT DOCUMENTS

2020/0234994 A1* 7/2020 Ryo ................... H01L 21/67092

FOREIGN PATENT DOCUMENTS

| CN | 110678965 A | 1/2020 |
| JP | 2003-034558 A | 2/2003 |

(Continued)

OTHER PUBLICATIONS

International Preliminary Report on Patentability mailed Sep. 1, 2022 for PCT/JP2021/004395.

*Primary Examiner* — Brigitte A Paterson
(74) *Attorney, Agent, or Firm* — Faegre Drinker Biddle & Reath LLP

(57) ABSTRACT

A workpiece cutting method includes: a first step of pasting an expandable sheet on a workpiece; a second step of irradiating, after the first step, the workpiece with laser light to form a modified region and expanding the expandable sheet to divide the workpiece into a plurality of chips, and meanwhile, to form a gap disposed between the plurality of chips and extending to a side surface of the workpiece; a third step of irradiating the expandable sheet with an ultraviolet light after the first step; a fourth step of filling, after the second step and the third step, the gap with resin from an outer edge part of the workpiece including the side surface; a fifth step of curing the resin after the fourth step;

(Continued)

and a sixth step of taking out the chips from above the expandable sheet after the fifth step.

15 Claims, 16 Drawing Sheets

(51) Int. Cl.
 *H01L 21/56* (2006.01)
 *H01L 21/67* (2006.01)
 *H01L 21/683* (2006.01)

(58) Field of Classification Search
 CPC ........... H01L 21/67132; H01L 21/6715; H01L 21/6836; H01L 21/68336; H01L 21/78; H01L 2221/6834; H01L 2221/68336; B23K 26/0622; B23K 26/38; B23K 26/402; B23K 26/53; B23K 26/60; B23K 26/70; B23K 2101/40; B23K 2103/56
 See application file for complete search history.

(56) References Cited

FOREIGN PATENT DOCUMENTS

| | | | |
|---|---|---|---|
| JP | 2003-334675 A | | 11/2003 |
| JP | 2004-095097 A | | 3/2004 |
| JP | 2006-152072 A | | 6/2006 |
| JP | 2006-229128 A | | 8/2006 |
| JP | 2007-142206 A | | 6/2007 |
| JP | 2008-218708 A | | 9/2008 |
| JP | 2008-276824 A | | 11/2008 |
| JP | 2011-151231 A | | 8/2011 |
| JP | 2013-105797 A | | 5/2013 |
| JP | 2015-028981 A | | 2/2015 |
| JP | 2016-119402 A | | 6/2016 |
| JP | 2017-143131 A | | 8/2017 |
| JP | 2017-147283 A | | 8/2017 |
| JP | 2018-198241 A | | 12/2018 |
| JP | 2018198274 A | * 12/2018 | ......... B23K 26/0006 |
| JP | 2019-197758 A | | 11/2019 |
| TW | 201034070 | | 9/2010 |

* cited by examiner

Fig.14
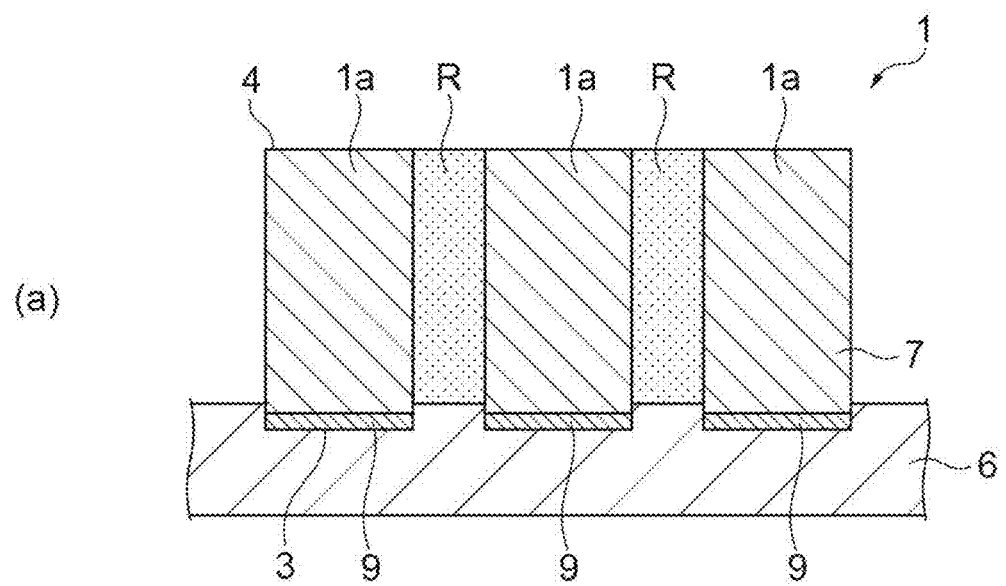
(a)
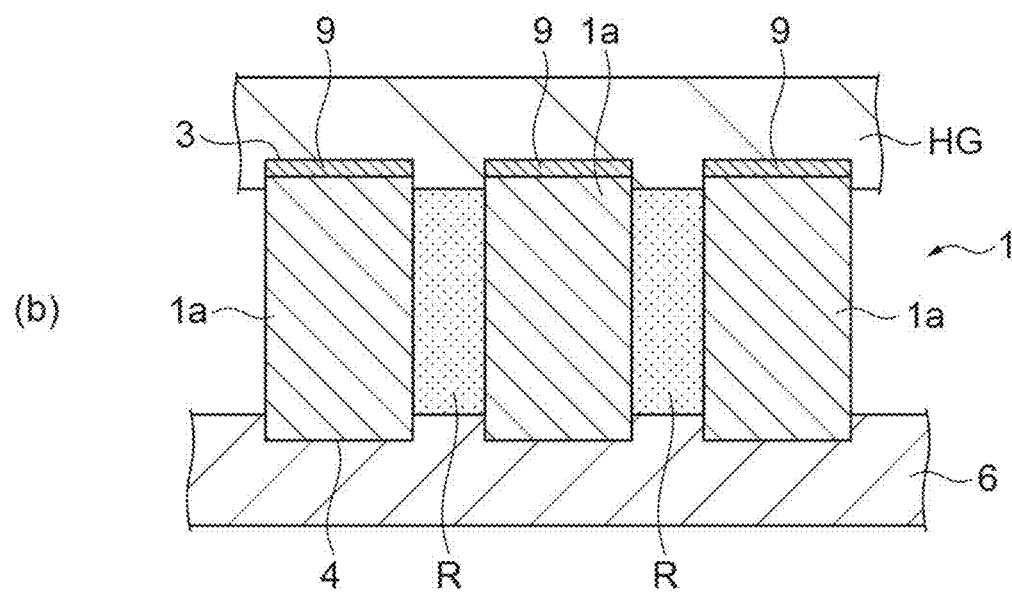
(b)

WORKPIECE CUTTING METHOD AND RESIN APPLYING DEVICE

TECHNICAL FIELD

One aspect of the present invention relates to a workpiece cutting method and a resin applying device.

BACKGROUND ART

Conventionally, a workpiece cutting method of dividing a workpiece into a plurality of chips is known. As a technique of this type, Patent Literature 1 describes a technique of removing electricity of a forming substance of a workpiece (a substance that constitutes the workpiece or a substance that has been used to form the workpiece) when stress is applied through a sheet to the workpiece on which a modified region serving as a starting point of cutting is formed.

CITATION LIST

Patent Literature

Patent Literature 1: Japanese Unexamined Patent Publication No. 2007-142206

SUMMARY OF INVENTION

Technical Problem

In the workpiece cutting method as described above, if particles remain on a cut surface of the chip, there is a problem that, for example, the particles come off from the cut surface of the chip during the subsequent conveyance step or the like and adhere to functional elements or the like of the chip. In addition, in the workpiece cutting method as described above, it is desired to shorten the working time (so-called shortening of the takt time).

One aspect of the present invention has been made in view of such circumstances, and an object of the present invention is to provide a workpiece cutting method and a resin applying device that can remove particles remaining on a cut surface of a chip and shortening a working time.

Solution to Problem

A workpiece cutting method according to one aspect of the present invention includes: a first step of pasting an expandable sheet on a front surface or a back surface of a workpiece; a second step of irradiating, after the first step, the workpiece with laser light along a line to cut to form a modified region and expanding the expandable sheet to divide at least a part of the workpiece into a plurality of chips, and meanwhile, to form a gap disposed between the plurality of chips and extending to a side surface of the workpiece; a third step of irradiating the expandable sheet with an ultraviolet light after the first step; a fourth step of filling, after the second step and the third step, the gap with resin from an outer edge part of the workpiece including the side surface; a fifth step of curing the resin after the fourth step; and a sixth step of taking out the plurality of chips from above the expandable sheet after the fifth step.

In this workpiece cutting method, the workpiece is divided into the plurality of chips, the resin is filled between the plurality of chips, the filled resin is cured, and the chips are taken out. At the time of taking out the chip, the particles remaining on the cut surface of the chip can be attached to the resin to remove the particles. It is also found that irradiating the expandable sheet with the ultraviolet light can improve the wettability of the expandable sheet. Therefore, by irradiating the expandable sheet with the ultraviolet light before filling with the resin, the time until the filling with the resin is completed can be shortened. Therefore, the particles remaining on the cut surface of the chip can be removed, and the working time can be shortened.

In the workpiece cutting method according to one aspect of the present invention, in the fourth step, the gap may be filled with the resin in a state where the workpiece is placed on a table, and the table may be inclined to make a position where the resin is applied on the table be higher than the workpiece. By inclining the table on which the workpiece is placed in this manner, the time until the filling with the resin is completed can be further shortened.

In the workpiece cutting method according to one aspect of the present invention, in the fifth step, the resin filled in the gap of the workpiece may be cured in a state where the workpiece is placed on the table and by irradiating the resin with the ultraviolet light from below. In this case, air bubbles can be suppressed from being contained in the cured resin.

In the workpiece cutting method according to one aspect of the present invention, in the fourth step, the gap is filled with the resin in a state where the workpiece is placed on the table, and the resin may be filled by an amount that allows a liquid level of the resin to be located below an upper surface of the workpiece and above the modified region closest to the upper surface. This can prevent overflow of the resin from between the plurality of chips, and meanwhile, enables the particles remaining on the cut surface of the chip to be removed.

In the workpiece cutting method according to one aspect of the present invention, in the first step, the workpiece may be pasted with the expandable sheet, a protective sheet, or a protective tape on one of the front surface and the back surface located closer to a device layer, the front surface and the back surface being of the workpiece. This can prevent deterioration of the characteristics of the device layer.

In the workpiece cutting method according to one aspect of the present invention, in the first step, the workpiece may be pasted with the expandable sheet on one of the front surface and the back surface located opposite a device layer, the front surface and the back surface being of the workpiece, and in the fourth step, before the resin is applied, the protective sheet or the protective tape may be pasted on the other of the front surface and the back surface closer to a device layer, the front surface and the back surface being of the workpiece. This can prevent deterioration of the characteristics of the device layer.

In the workpiece cutting method according to one aspect of the present invention, in the second step, the expandable sheet may be expanded to allow the gap to become 10 μm to 300 μm. If the gap is too narrow, when the chip is taken out, the resin filled and cured in the gap cannot be held on the expandable sheet side, and a part of the resin adheres to the chip that has been taken out. If the gap is too wide, the required amount of resin increases and the cost increases, and in addition, the speed at which the gap is filled with the resin (speed at which the resin penetrates) also decreases. In this regard, in the case where the gap is 10 μm to 300 μm, while the required amount of resin is suppressed, the resin can be reliably held on the expandable sheet side at the time of taking out the chip and adhesion of a part of the resin to the chip can be suppressed.

A resin applying device according to one aspect of the present invention includes: a table on which a workpiece having an expandable sheet attached to a front surface or a back surface is placed; a resin applying portion configured to apply resin to the expandable sheet of the workpiece placed on the table; and an ultraviolet irradiating portion configured to irradiate the workpiece placed on the table with ultraviolet light, in which the workpiece placed on the table has the expandable sheet being expanded, is divided into a plurality of chips in at least a part of the workpiece, and is formed with a gap disposed between the plurality of chips and extending to a side surface of the workpiece, the resin applying portion fills the gap with the resin from an outer edge part of the workpiece including the side surface, and the ultraviolet irradiating portion irradiates, with the ultraviolet light before the resin is applied, the expandable sheet pasted on the workpiece placed on the table, and irradiates, with the ultraviolet light after the resin is applied, the resin filled in the gap of the workpiece placed on the table.

According to this resin applying device, the resin can be filled between the plurality of chips of the workpiece and can be cured. Therefore, at the time of taking out the chip, particles remaining on the cut surface of the chip can be attached to the resin to remove the particles. By irradiating the expandable sheet with the ultraviolet light before the resin is applied, the wettability of the expandable sheet can be improved and the time until the filling with the resin is completed can be shortened. Therefore, the particles remaining on the cut surface of the chip can be removed, and the working time can be shortened. In addition, the application of the resin and the irradiation with the ultraviolet light can be performed using the same table, that is, after the resin is applied, the workpiece can be irradiated with the ultraviolet light without being conveyed. Therefore, the overflow of the applied resin before curing due to vibration or the like caused by conveyance can be suppressed. Furthermore, the time from application of the resin to curing of the resin by irradiation with the ultraviolet light can be shortened, and deterioration of characteristics of the device layer due to the uncured resin can also be suppressed.

The resin applying device according to one aspect of the present invention may further include an expanding portion configured to expand the expandable sheet pasted on the front surface or the back surface of the workpiece formed with a modified region along a line to cut, divide at least a part of the workpiece into the plurality of chips, and form the gap disposed between the plurality of chips and extending to the side surface of the workpiece. In this case, the expanding portion can be used to divide the workpiece into the chips and to form the gap.

Advantageous Effects of Invention

According to one aspect of the present invention, it is possible to provide the workpiece cutting method and the resin applying device that can remove particles remaining on the cut surface of the chip and shortening the working time.

BRIEF DESCRIPTION OF DRAWINGS

FIG. 14(a) is a cross-sectional view showing an example in which an expanding tape is pasted on a front surface of the workpiece on a device layer side. FIG. 14(b) is a cross-sectional view showing an example in which a protective sheet is pasted on the front surface of the workpiece on the device layer side.

DESCRIPTION OF EMBODIMENTS

Figure 1:
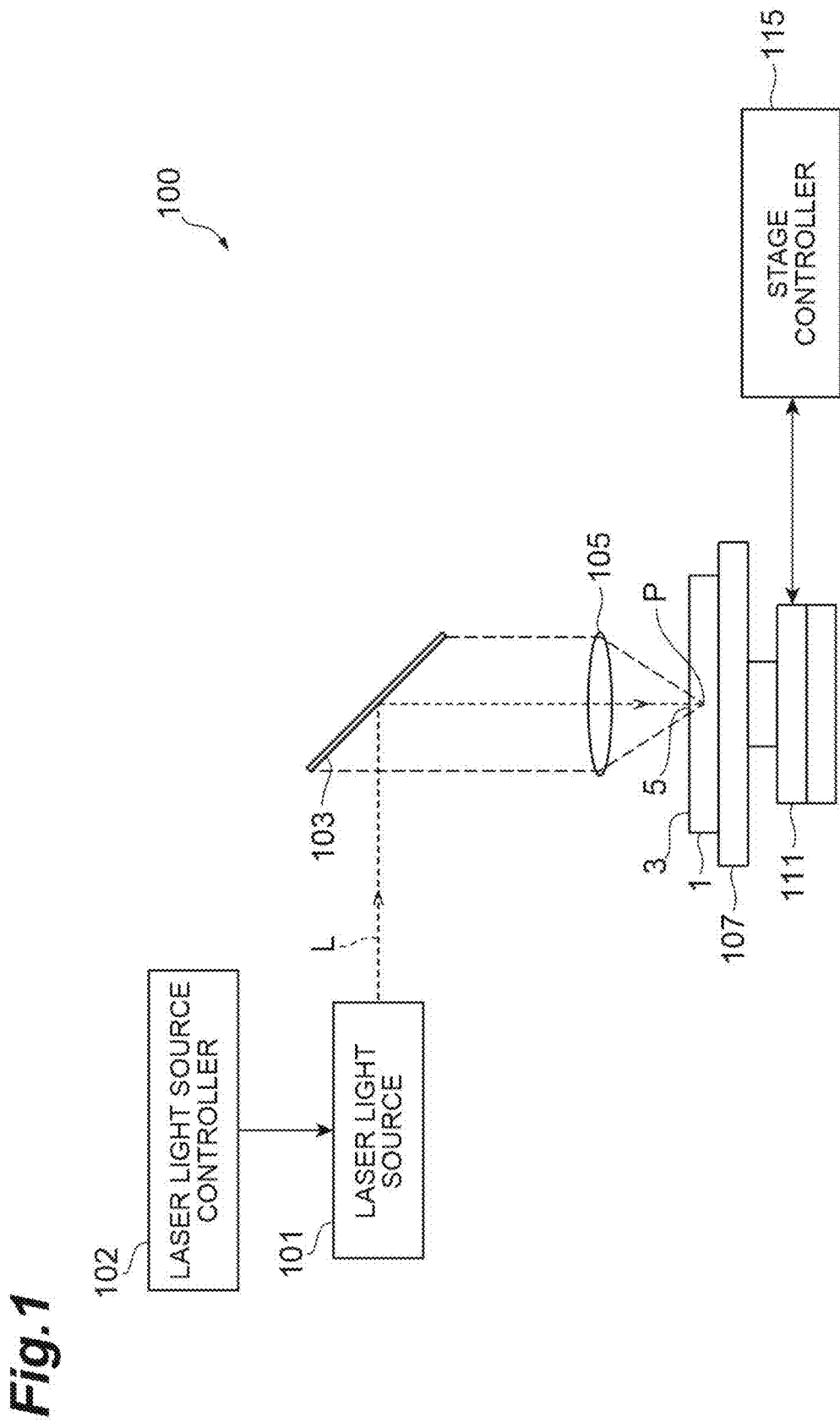
FIG. 1 is a schematic configuration diagram of a laser processing device used for forming a modified region.

Hereinafter, an embodiment is described in detail with reference to the drawings. In the drawings, the same or corresponding parts are denoted by the same reference numerals, and redundant description is omitted.

In a workpiece cutting method according to the embodiment, a modified region is formed in a workpiece along a line to cut by converging laser light on the workpiece. Therefore, first, formation of the modified region is described with reference to FIGS. 1 to 6.

As shown in FIG. 1, a laser processing device 100 is a device used for performing a workpiece cutting method. The laser processing device 100 includes a laser light source 101 which is a laser light emitting portion that emits a pulse of laser light L, a dichroic mirror 103 disposed to change a direction of the optical axis (optical path) of the laser light L by 90°, and a converging lens 105 for converging the laser light L. In addition, the laser processing device 100 includes a support table 107 for supporting a workpiece 1 to be irradiated with the laser light L converged by the converging lens 105, a stage 111 for moving the support table 107, a laser light source controller 102 for controlling the laser light source 101 in order to adjust an output (pulse energy, light intensity), a pulse width, a pulse waveform, and the like of the laser light L, and a stage controller 115 for controlling the movement of the stage 111.

In the laser processing device 100, the direction of the optical axis of the laser light L emitted from the laser light source 101 is changed by 90° by the dichroic mirror 103, and the laser light L is converged by the converging lens 105 inside the workpiece 1 placed on the support table 107. At the same time, the stage 111 is moved, and the workpiece 1 is moved relative to the laser light L along a line to cut 5. As a result, the modified region along the line 5 is formed in the workpiece 1. Note that the stage 111 is moved to relatively move the laser light L, but the converging lens 105 may be moved, or both of the stage and the lens may be moved.

Figure 2:
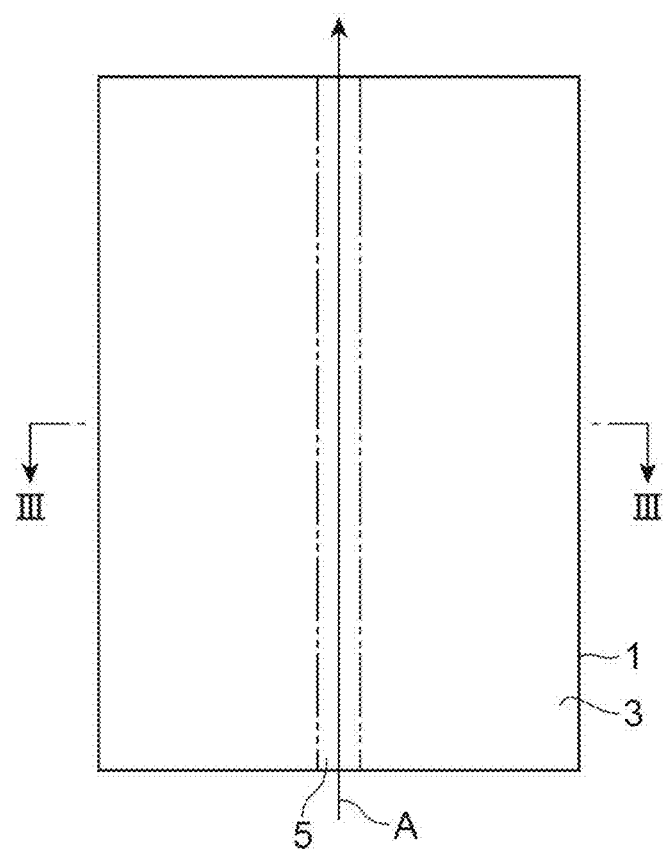
FIG. 2 is a plan view of a workpiece as a target for forming the modified region.
Figure 3:
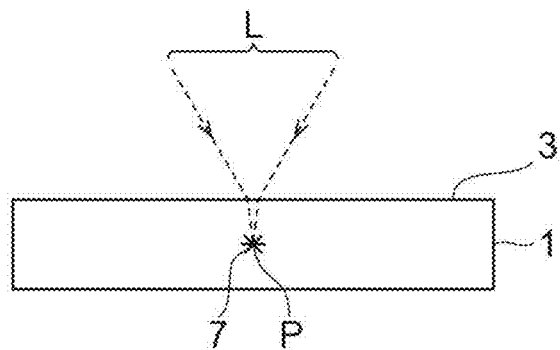
FIG. 3 is a cross-sectional view of the workpiece taken along a line III-III in FIG. 2.
Figure 4:
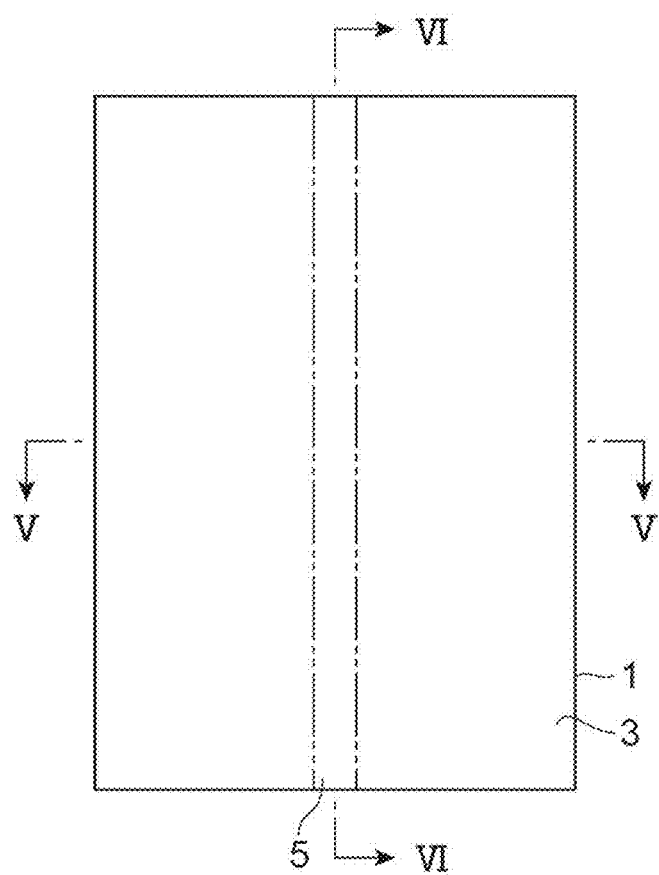
FIG. 4 is a plan view of the workpiece after laser processing.
Figure 5:
FIG. 5 is a cross-sectional view of the workpiece taken along a line V-V in FIG. 4.
Figure 6:
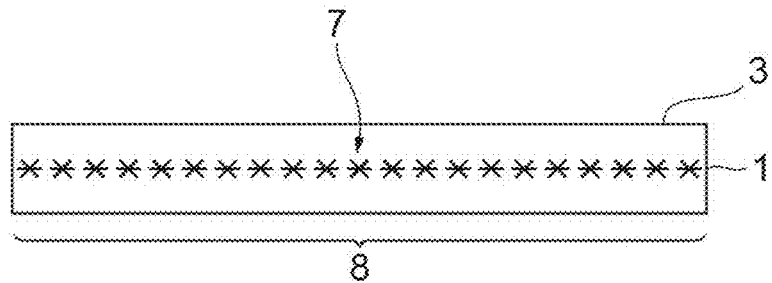
FIG. 6 is a cross-sectional view of the workpiece taken along a line VI-VI in FIG. 4.

As the workpiece 1, a plate-like member (such as a substrate or a wafer) including a semiconductor substrate formed of semiconductor material, a piezoelectric substrate formed of piezoelectric material, or the like is used. As shown in FIG. 2, a line to cut 5 for cutting the workpiece 1 is set in the workpiece 1. The line 5 is an imaginary line extending linearly. At the time of forming the modified region inside the workpiece 1, as shown in FIG. 3, the laser light L is relatively moved along the line 5 (that is, in a direction of an arrow A in FIG. 2) with a converging point (converging position) P aligned inside the workpiece 1. As a result, as shown in FIGS. 4, 5, and 6, a modified region 7 is formed in the workpiece 1 along the line 5, and the modified region 7 formed along the line 5 becomes a cutting start region 8.

The converging point P is a portion where the laser light L is converged. The line 5 is not limited to a linear shape, and may be a curved shape, a three-dimensional shape in which these shapes are combined, or a line specified by coordinates. The line 5 is not limited to an imaginary line, and may be a line actually drawn on a front surface 3 of the workpiece 1. The modified region 7 may be formed continuously or intermittently. The modified region 7 may have a row shape or a dot shape, and in short, the modified region 7 may be formed at least inside the workpiece 1. In addition, a crack may be formed starting from the modified region 7, and the crack and the modified region 7 may be exposed to the outer surface (the front surface 3, a back surface, or an outer peripheral surface) of the workpiece 1. A laser light incidence surface at the time of forming the modified region 7 is not limited to the front surface 3 of the workpiece 1, and may be the back surface of the workpiece 1.

Incidentally, in the case where the modified region 7 is formed inside the workpiece 1, the laser light L passes through the workpiece 1 and is particularly absorbed in the vicinity of the converging point P located inside the workpiece 1. As a result, the modified region 7 is formed in the workpiece 1 (that is, formed by internal absorption type laser processing). In this case, because the laser light L is hardly absorbed by the front surface 3 of the workpiece 1, the front surface 3 of the workpiece 1 does not melt. On the other hand, in the case where the modified region 7 is formed on the front surface 3 or the back surface of the workpiece 1, the laser light L is particularly absorbed in the vicinity of the converging point P located on the front surface 3 or the back surface, and the workpiece melts and is removed from the front surface 3 or the back surface to form a removed portion such as a hole or a groove (surface absorption type laser processing).

The modified region 7 is a region in which density, refractive index, mechanical strength, and other physical characteristics are different from those of the surroundings. Examples of the modified region 7 include a melting treatment region (which means at least one of a region once melted and re-solidified, a region in a molten state, and a region in a state during re-solidifying from melting), a crack region, a dielectric breakdown region, a refractive index changing region, and the like, and there is also a region in which these regions are mixed. Further, the modified region 7 includes a region in which a density of the modified region 7 is changed as compared with a density of an unmodified region in the material of the workpiece 1, and a region in which lattice defects are formed. In the case of the material of the workpiece 1 being single crystal silicon, the modified region 7 can also be said to be a high dislocation density region.

The melting treatment region, the refractive index changing region, the region in which the density of the modified region 7 is changed as compared with the density of the unmodified region, and the region in which the lattice defect is formed may further include cracks (fractures and microcracks) inside these regions or at an interface between the modified region 7 and the unmodified region. The included crack may extend over the entire surface of the modified region 7, or may be formed only partially or in a plurality of portions thereof. The workpiece 1 includes a substrate made of crystal material having a crystal structure. For example, the workpiece 1 includes a substrate formed of at least one of gallium nitride (GaN), silicon (Si), silicon carbide (SiC), $LiTaO_3$, and sapphire ($Al_2O_3$). In other words, the workpiece 1 includes, for example, a gallium nitride substrate, a silicon substrate, a SiC substrate, an $LiTaO_3$ substrate, or a sapphire substrate. The crystal material may be either an anisotropic crystal or an isotropic crystal. In addition, the workpiece 1 may include a substrate made of amorphous material having a non-crystalline structure (amorphous structure), and may include, for example, a substrate formed of glass. The workpiece 1 may include, for example, a quartz substrate formed of quartz.

In the embodiment, the modified region 7 can be formed by forming a plurality of modified spots (processing marks) along the line 5. In this case, the plurality of modified spots gather to form the modified region 7. The modified spot is a modified portion formed by a single pulse shot of pulsed laser light (that is, laser irradiation of one pulse: laser shot). Examples of the modified spot include a crack spot, a melting treatment spot, a refractive index changing spot, or a mixture of at least one of these spots. The size of the modified spot and the length of the crack to be generated can be appropriately controlled in consideration of the required cutting accuracy, the required flatness of the cut surface, the thickness, the type, the crystal orientation, and the like of the workpiece 1. In the embodiment, the modified spots can be formed as the modified region 7 along the line 5.

Next, a resin applying device used for carrying out the workpiece cutting method is described.

Figure 7:
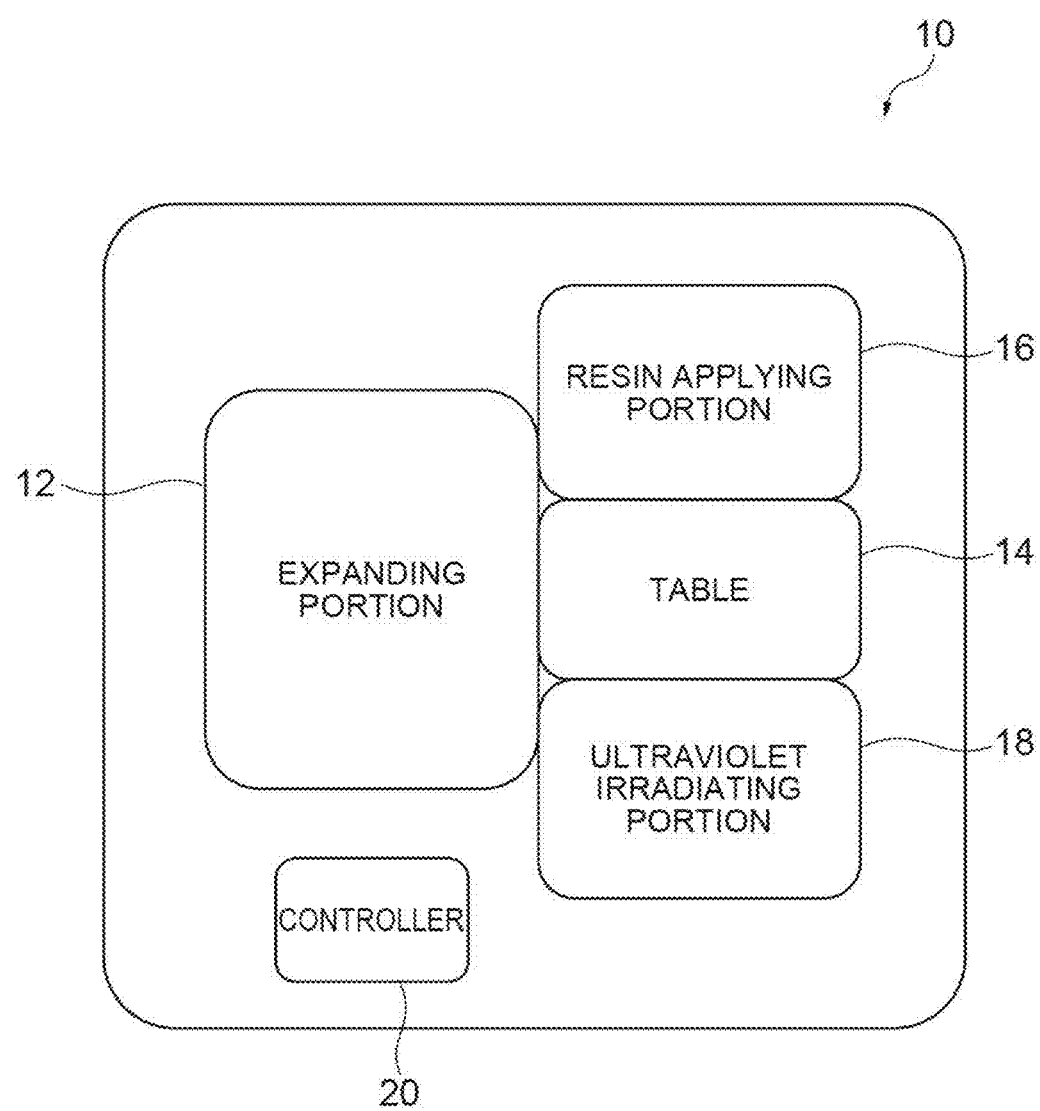
FIG. 7 is a block diagram showing a schematic configuration of a resin applying device.

As shown in FIG. 7, the resin applying device 10 includes an expanding unit 12, a table 14, a resin applying unit 16, an ultraviolet irradiating unit 18, and a controller 20. The expanding unit 12 expands an expanding tape (expandable sheet) 6 pasted on the front surface 3 or the back surface of the workpiece 1 formed with the modified region 7 along the line 5 by the laser processing device 100, divides at least a part of the workpiece 1 into a plurality of chips 1*a*, and forms a gap disposed between the plurality of chips 1*a* and extending to the side surface of the workpiece 1. The expanding unit 12 is not particularly limited, and various expanding mechanisms can be used.

Figure 8:
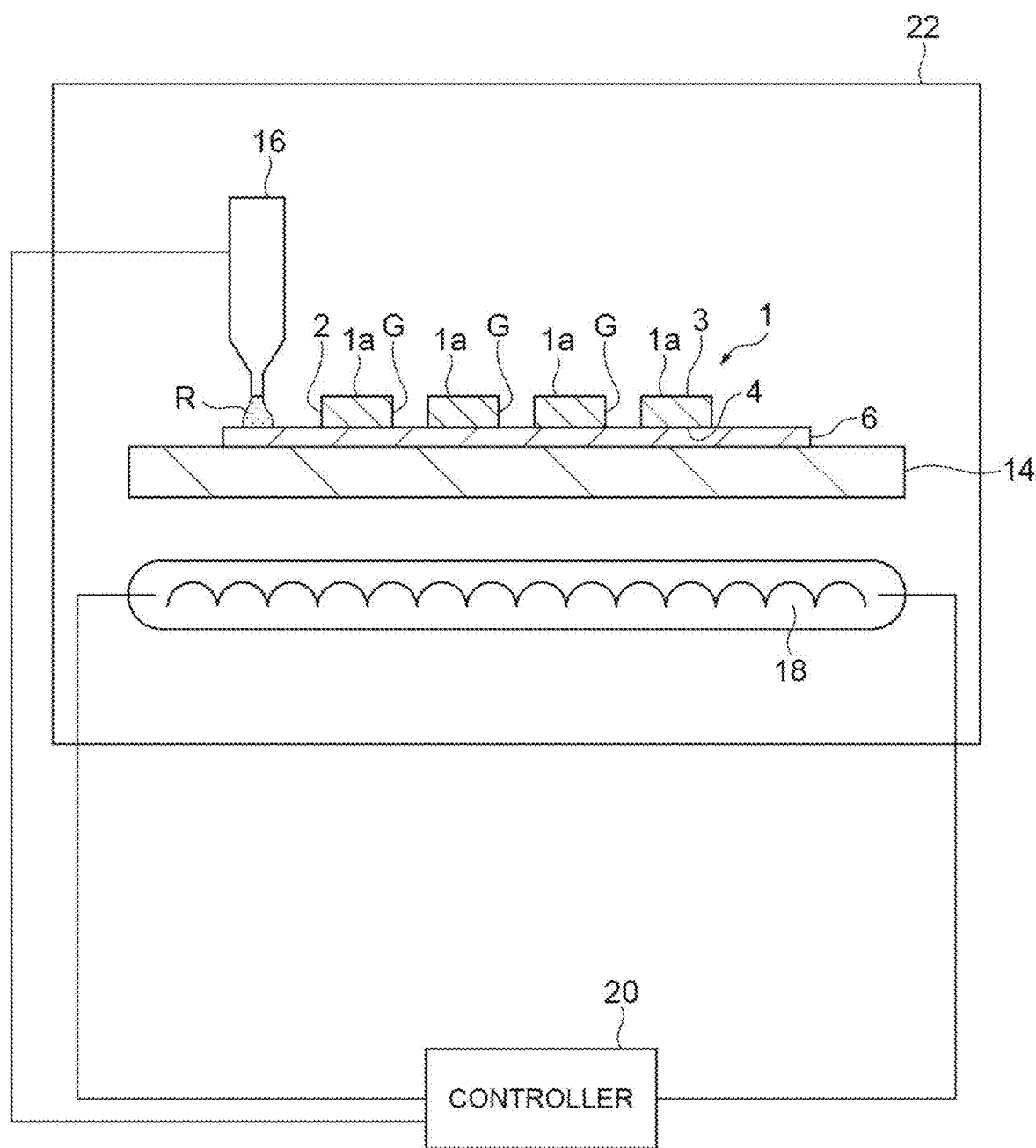
FIG. 8 is a schematic view showing a table, a resin applying portion, and an ultraviolet irradiating portion.

As shown in FIGS. 7 and 8, the workpiece 1 after the expanding tape 6 is expanded by the expanding unit 12 is placed on the table 14. The resin applying unit 16 applies resin R onto the expanding tape 6 attached to the workpiece 1 placed on the table 14. The resin applying unit 16 is, for example, a dispenser. The resin applying unit 16 fills a gap G with the resin R from the outer edge part including a side surface 2 of the workpiece 1 (details are described later).

The ultraviolet irradiating unit 18 irradiates the workpiece 1 placed on the table 14 with the ultraviolet light. The ultraviolet irradiating unit 18 irradiates the expanding tape 6 pasted on the workpiece 1 placed on the table 14 with the ultraviolet light before the resin R is applied, and irradiates the resin R filled in the gap of the workpiece 1 placed on the table 14 with the ultraviolet light after the resin R is applied (details are described later). The table 14, the resin applying unit 16, and the ultraviolet irradiating unit 18 are disposed in a chamber 22. The inside of the chamber 22 is sealed and purged with nitrogen, for example.

The controller 20 is a computer including a central processing unit (CPU), a read only memory (ROM), a random access memory (RAM), and the like. The control of various operations in the controller 20 is performed by, for example, loading a program stored in the ROM onto the RANI and executing the program by the CPU. The controller 20 may be configured as hardware by an electronic circuit or the like. The controller 20 controls various operations of the resin applying device 10. The controller 20 controls application of the resin R by the resin applying unit 16. The controller 20 controls irradiation of the ultraviolet light by the ultraviolet irradiating unit 18.

Next, a workpiece cutting method is described.

The workpiece cutting method is used as a chip manufacturing method for manufacturing a plurality of chips by performing laser processing on the workpiece 1. The workpiece cutting method can be performed using the laser processing device 100 and the resin applying device 10 described above. The workpiece 1 has, for example, a disk shape having a thickness of 400 μm and a diameter of 8 inches. The workpiece 1 is, for example, a sapphire substrate, an SiC substrate, a glass substrate (tempered glass substrate), a quartz substrate, a silicon substrate, a semiconductor substrate, a transparent insulating substrate, or the like. Here, the workpiece 1 is a single crystal silicon substrate.

The workpiece 1 is formed with a device layer on the front surface 3 side, which is the laser light incidence surface side thereof. The device layer includes a plurality of functional elements (for example, a light receiving element such as a photodiode, a light emitting element such as a laser diode, a circuit element formed as a circuit, and the like) arranged in a matrix. On the front surface 3 of the workpiece 1, a plurality of the lines 5 (see FIG. 1) extending so as to pass between adjacent functional elements is set. The plurality of lines to cut 5 extend in a lattice shape. The device layer referred to herein is a layer including at least one of a functional element, a structure, a laminate, a film structure, a resin layer (DAF or the like), and the like. The device layer is not particularly limited. In addition, a damage to the device layer here includes at least two types of modes: a "mode of penetrating between layers" and a mode of adhering to the front surface". The "mode of penetrating between layers" is a mode in which, in the workpiece 1, the resin R penetrates between the device layer and the base material such as silicon or glass on which the device layer is laminated. It is considered that the "mode of penetrating between layers" may occur when adhesion between the device layer and the substrate is weak, or when any layer of the multilayer structure is easily influenced by the resin R (in solubility, affinity, etc.). The "mode of adhering to the front surface" is a mode in which the resin R runs onto the front surface of the device layer. It is considered that the "mode of adhering to the front surface" may occur in a case where the front surface is in a state having high affinity with the resin R, or the like.

Figure 9:
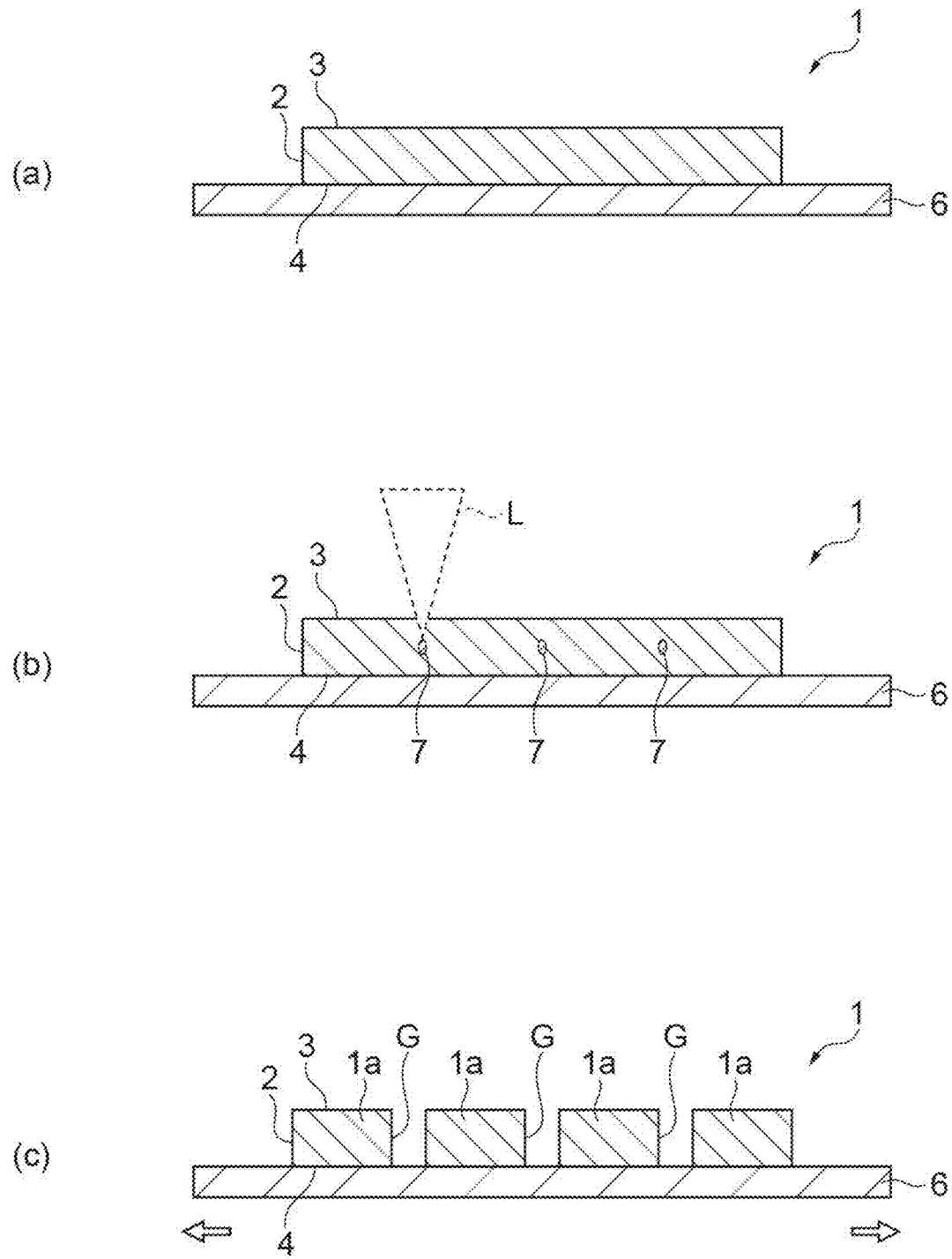
FIG. 9(a) is a schematic cross-sectional view for explaining the workpiece cutting method according to an embodiment.
FIG. 9(b) is a schematic cross-sectional view showing a continuation of FIG. 9(a).
FIG. 9(c) is a schematic cross-sectional view showing a continuation of FIG. 9(b).

First, in the workpiece cutting method, as shown in FIG. 9(*a*), the expanding tape 6 is pasted on the back surface 4 of the workpiece 1 (first step). The expanding tape 6 is held by, for example, an annular frame. The expanding tape 6 is a tape material on the ultraviolet curing side. The expanding tape 6 includes a central region where the workpiece 1 is disposed and an outer edge region where the workpiece 1 is not disposed.

Subsequently, the laser processing device 100 irradiates the workpiece 1 with the laser light L along the line 5. As a result, as shown in FIG. 9(*b*), the modified region 7 is formed at least inside the workpiece 1 along the line 5 (second step). In forming the modified region 7, the processing condition is not particularly limited as long as the processing condition is the one that enables the workpiece to be divided into the plurality of chips 1*a* by expanding the expanding tape 6 at the subsequent stage. For example, the crack may be exposed on at least one of the front surface 3 and the back surface 4 of the workpiece 1, or the crack may not be exposed.

Subsequently, the expanding tape 6 is expanded by the expanding unit 12. As a result, as shown in FIG. 9(*c*), for example, a crack extending from the modified region 7 is extended to divide the workpiece 1 into the plurality of chips 1*a*. At the same time, an interval between the chips 1*a* is expanded to form the gap G disposed between the plurality of chips 1*a* and extending to the side surface 2 orthogonal (intersecting) to the front surface 3 and the back surface 4 of the workpiece 1 (second step).

The gap G has a distance that allows the resin to penetrate in the subsequent stage of filling with the resin. The gap G is not particularly limited, but may be, for example, 10 μm to 300 μm, and is 50 μm here. The division into the plurality of chips 1*a* may be completed at the time when the modified region 7 is formed, and in this case, the expanding tape 6 is expanded for the purpose of securing the interval between the chips 1*a*. For holding the workpiece 1 after the expanding tape 6 is expanded, a grip ring, heat shrink, or the like can be used. After the expanding tape 6 is expanded, at least a part of the gap G formed between the plurality of chips 1*a* reaches the side surface 2 of the workpiece 1.

Figure 10:
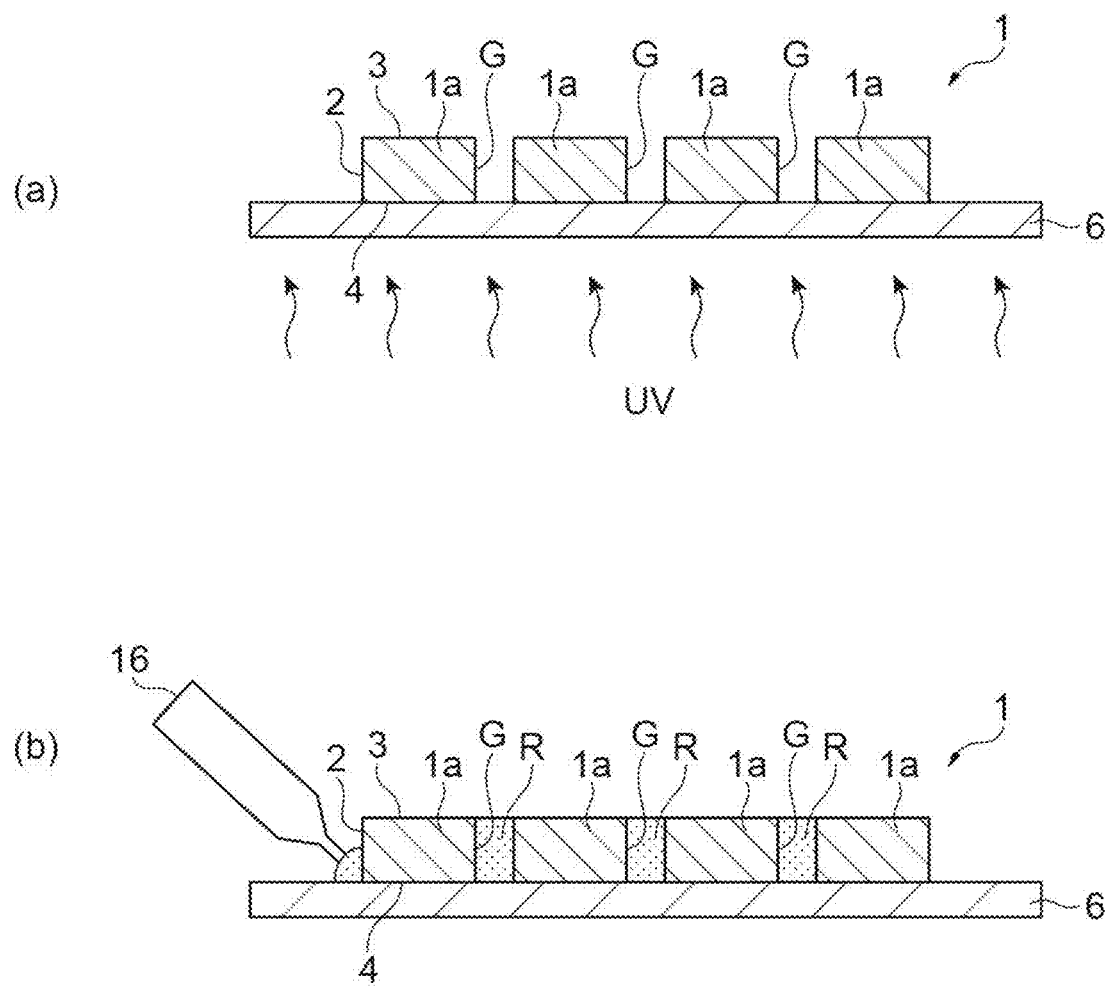
FIG. 10(a) is a schematic cross-sectional view showing a continuation of FIG. 9(c).
FIG. 10(b) is a schematic cross-sectional view showing a continuation of FIG. 10(a).

Subsequently, the workpiece 1 having the expanding tape 6 expanded is placed on the table 14 (see FIG. 8). As shown in FIG. 10(*a*), the ultraviolet irradiating unit 18 irradiates the expanding tape 6 of the workpiece 1 with the ultraviolet light from below (from the back surface 4 side) (third step). The irradiation with the ultraviolet light may be performed a plurality of times or may be performed once. Accordingly, the expanding tape 6 is cured to improve wettability (wet tension) of the expanding tape 6. The adhesive force of the expanding tape 6 is reduced.

As shown in FIG. 10(*b*), the resin R is applied by the resin applying unit 16 to the periphery away by a predetermined length from the side surface 2 of the workpiece 1. As a result, the gap G is filled with the resin R from the side surface 2 of the workpiece 1 (fourth step). Here, the resin R is applied by the resin applying unit 16 to one or a plurality of places in the periphery of the workpiece 1 on the outer edge region of the expanding tape 6. Alternatively, while the resin R is applied by the resin applying unit 16 to a position away from the side surface 2 of the workpiece 1, the resin applying unit 16 is moved one turn, a plurality of turns, or one turn or less along the periphery of the workpiece 1. Instead of or in addition to the movement of the resin applying unit 16, the table 14 on which the workpiece 1 is placed may be rotated.

In the filling with the resin, the gap G is not directly filled with the resin R, but the resin R dropped in the periphery of the workpiece 1 on the expanding tape 6 advances (penetrates) through the gap G using at least one of a capillary phenomenon, selective wettability of a material side surface, and surface tension. In the filling with the resin, the resin R does not protrude onto the front surface 3 of the workpiece 1, and the resin R does not return through the gap G.

The resin R is a liquid resin. The resin R is an ultraviolet curing resin. As the resin R, a resin having a shrinkage rate at the time of curing higher than a predetermined rate is selected so as to be easily peeled off from the chip 1a at the subsequent stage. The resin R may be a gel, semi-solid, jelly, mousse, or paste (kneaded) resin. The position where the resin R is applied may be, for example, 0.5 mm away from the side surface 2.

Figure 11:
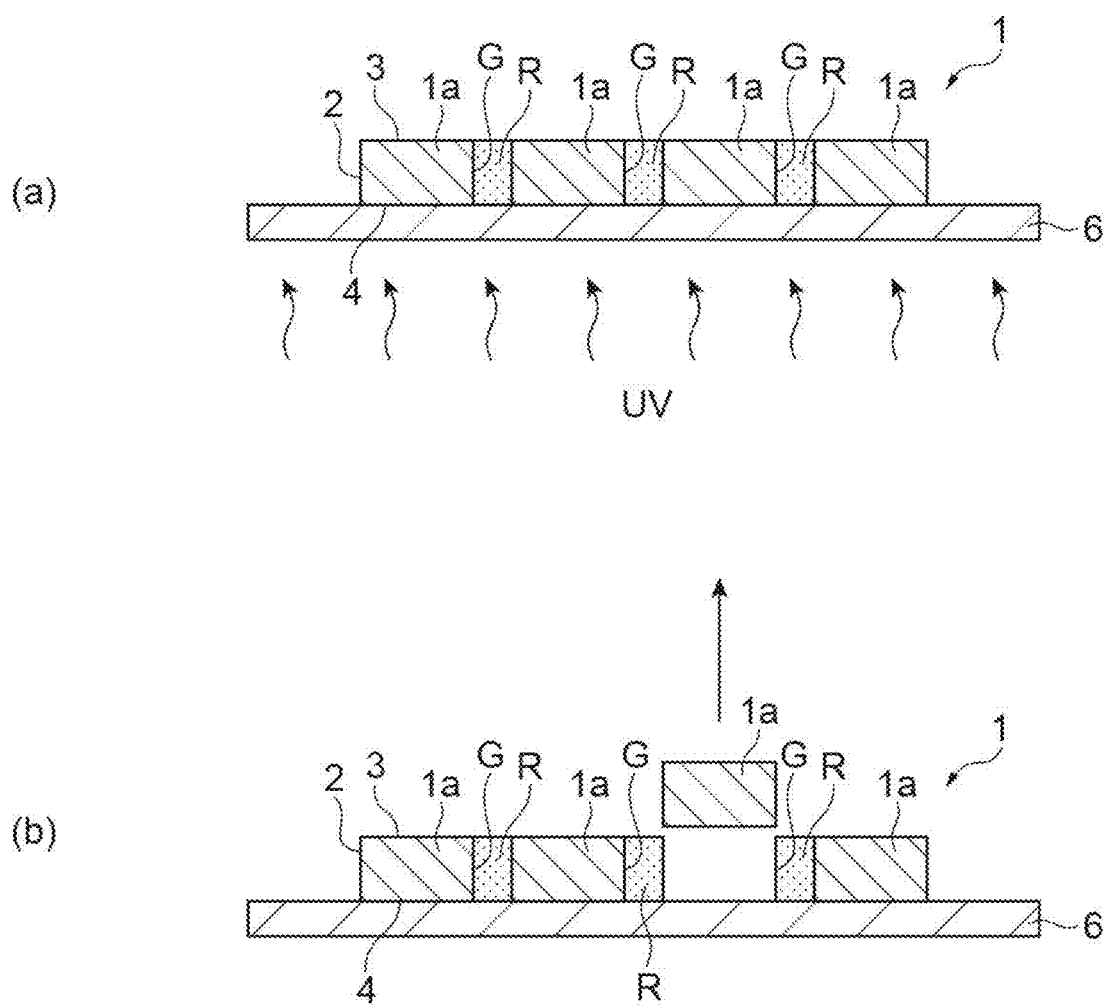
FIG. 11(a) is a schematic cross-sectional view showing a continuation of FIG. 10(b).
FIG. 11(b) is a schematic cross-sectional view showing a continuation of FIG. 11(a).

Subsequently, with the workpiece 1 placed on the table 14, the ultraviolet irradiating unit 18 irradiates the resin R filled in the gap G of the workpiece 1 with the ultraviolet light from below as shown in FIG. 11(*a*). As a result, the resin R is cured and shrunk (fifth step). The irradiation with the ultraviolet light may be performed a plurality of times or may be performed once.

As shown in FIG. 11(*b*), the chip 1a is picked up and taken out from the expanding tape 6 (sixth step). In the pickup of the chip 1a, the cured resin R is peeled off from the side surface of the chip 1a, attached to the expanding tape 6 instead of the chip 1a, and left on the expanding tape 6. Incidentally, the peeling between the chip 1a and the resin R may be realized by shrinkage at the time of curing the resin R by irradiation with the ultraviolet light instead of or in addition to being realized by the force of pickup, or may be realized by expanding the expanding tape 6 again after the resin R is cured.

As described above, in the workpiece cutting method of the present embodiment, the workpiece 1 is divided into the plurality of chips 1a, the resin R is filled between the plurality of chips 1a, the filled resin R is cured, and the chips 1a are taken out. At the time of taking out the chip 1a, particles remaining on the cut surface of the chip 1a can be attached to the resin R to remove the particles. Further, by irradiating the expanding tape 6 with the ultraviolet light before the resin R is filled, the wettability of the expanding tape 6 can be improved, the filling speed (penetrating speed) of the resin R can be increased, and the time until the filling with the resin R between the plurality of chips 1a is completed can be shortened (shortening of the takt time). Therefore, the particles remaining on the cut surface of the chip 1a can be removed, and the working time can be shortened. In the present embodiment, for example, as compared with a case in which the expanding tape 6 is not irradiated with the ultraviolet light before the resin R is filled, the time until the filling with the resin R is completed can be shortened to about ⅛.

Figure 12:
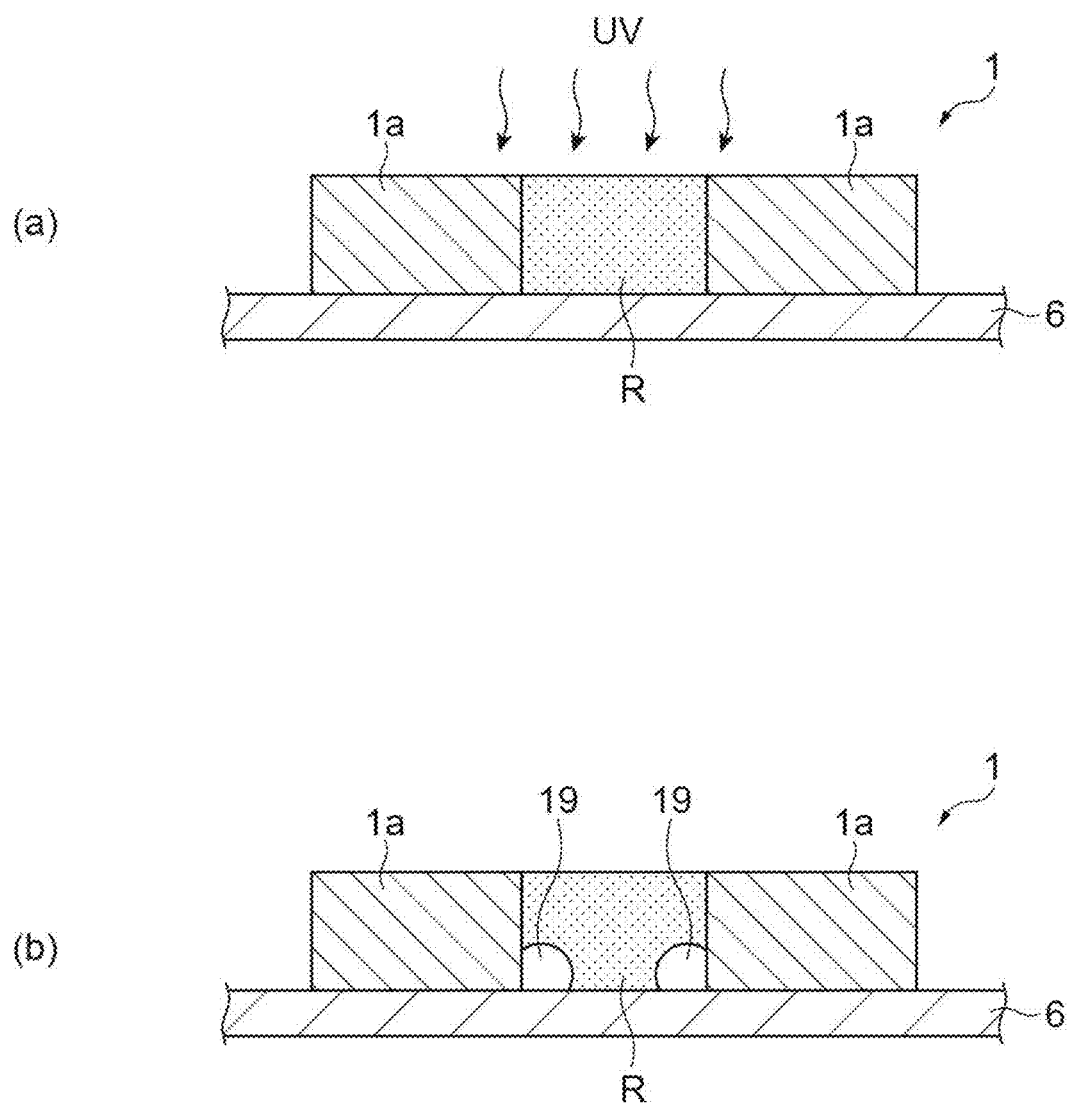
FIG. 12(a) is a schematic cross-sectional view for explaining a case where resin is irradiated with ultraviolet light from above.
FIG. 12(b) is a schematic cross-sectional view showing air bubbles contained in the cured resin.

In the workpiece cutting method of the present invention, the resin R filled in the gap G of the workpiece 1 is cured in a state where the workpiece 1 is placed on the table 14 and by irradiating the resin R with the ultraviolet light from below (from the expanding tape 6 side). For example, when the resin R is irradiated with the ultraviolet light from above as shown in FIG. 12(*a*), air bubbles 19 as shown in FIG. 12(*b*) are possibly contained inside the cured resin R. In the present embodiment, by irradiating the resin R with the ultraviolet light from below, the influence of shrinkage of the resin R can be released to the upper side which is the open side, and the generation of such air bubbles 19 can be suppressed.

Figure 13:
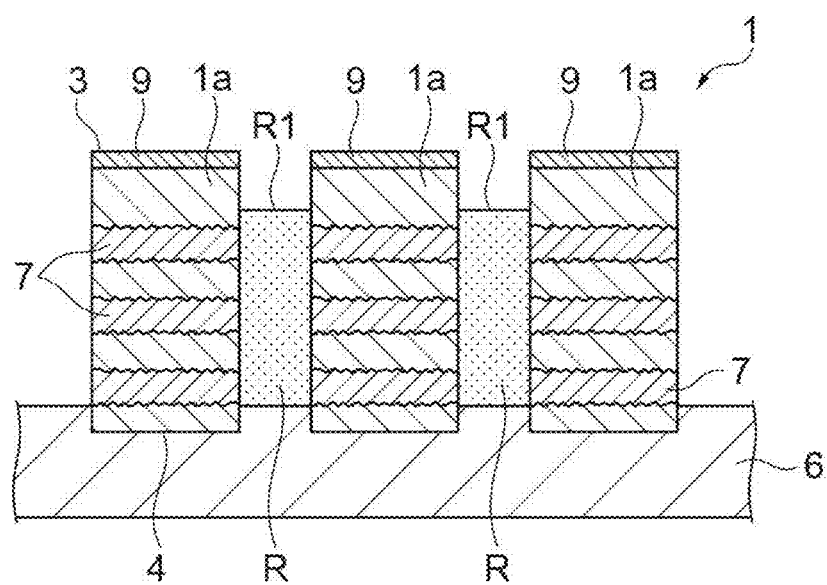
FIG. 13 is a schematic cross-sectional view showing an application amount of the resin.

In the workpiece cutting method of the present embodiment, the controller 20 may control the resin applying portion 16 to set the filling amount of the resin R as an amount in which a liquid level R1 of the resin R is located below the front surface (upper surface) 3 of the workpiece 1 and above the modified region 7 closest to the front surface 3 (see FIG. 13). This can prevent overflow of the resin R from between the plurality of chips 1a, and meanwhile, enables particles remaining on the cut surface of the chip 1a to be removed. In this case, because the resin R does not come into contact with a device layer 9, deterioration of the characteristics of the device layer 9 can be prevented (characteristics can be retained). For example, the resin R may reach, for example, at least 350 μm out of a plate thickness of 400 μm in the thickness direction of the workpiece 1.

Because the amount of the resin R that can penetrate the gap G per unit time by the capillary phenomenon is determined, when a flow rate (amount of the resin R applied per unit time) set by the controller 20 is too large, the resin R may overflow from the front surface 3 even if the filling amount (total amount of the resin R applied) is appropriate. Therefore, the controller 20 may be configured to be able to control the flow rate when the resin R is applied. In this case, the controller 20 can appropriately control the application flow rate of the resin R based on the amount of resin that can penetrate the gap G per unit time by the capillary phenomenon. This can suppress the overflow of the resin R from the front surface 3.

In the workpiece cutting method of the present embodiment, the expanding tape 6 may be expanded to allow the gap G to become 10 μm to 300 μm. If the gap G is too narrow, for example, if the gap G is narrower than 10 μm, when the chip 1a is taken out, the resin R filled and cured in the gap G cannot be held on the expanding tape 6 side, and a part of the resin R adheres to the chip 1a that is taken out. If the gap G is too wide, for example, wider than 300 μm, the required amount of resin increases and the cost increases, and in addition, the speed at which the gap G is filled with the resin R (speed at which the resin R penetrates) also decreases. In this regard, in the case where the gap G is 10 μm to 300 μm, while the required amount of resin is suppressed, the resin R can be reliably held on the expanding tape 6 side at the time of taking out the chip 1a and the adhesion of a part of the resin R to the chip 1a can be suppressed. Incidentally, in the present embodiment, for example, while the thickness of the chip 1a is 400 μm, the gap G of about 100 μm is provided to realize an aspect ratio of 4:1 or more.

According to the resin applying device 10 of the present embodiment, the resin R can be filled between the plurality of chips 1a of the workpiece 1 and can be cured. At the time of taking out the chip 1a, particles remaining on the cut surface of the chip 1a can be attached to the resin R to remove the particles. Further, by irradiating the expanding tape 6 with the ultraviolet light before the resin R is applied, the wettability of the expanding tape 6 can be improved, and the time until the filling with the resin R between the plurality of chips 1a is completed can be shortened. Therefore, the particles remaining on the cut surface of the chip 1a can be removed, and the working time can be shortened. In addition, the application of the resin R and the irradiation with the ultraviolet light can be performed using the same table 14, that is, after the resin R is applied, the workpiece 1 can be irradiated with the ultraviolet light without being conveyed. Therefore, the overflow of the applied resin R before curing due to vibration or the like caused by conveyance can be suppressed. Furthermore, the time from application of the resin R to curing of the resin R by irradiation with the ultraviolet light can be shortened, and deterioration of characteristics of the device layer 9 due to the uncured resin R can also be suppressed.

FIGS. 16(a) to 16(f) are plan views each showing a part of the chip 1a on the device layer 9 side in a state after the resin R is applied and the gap G is filled with the resin R and before the resin R is cured. In the states shown in FIGS. 16(a) to 16(f), the time from the application of the resin R has elapsed in this order. As shown in FIGS. 16(a) to 16(f), when the elapsed time from the application of the resin R exceeds a certain time, damage DM occurs in the device layer 9 due to the uncured resin R (see FIG. 16(e)). Thereafter, it is found that the damage DM progresses (in the drawing, the damage expands so as to extend inward)(see FIG. 16(f)). From this result, by shortening the time from application of the resin R to curing of the resin R by irradiation with the ultraviolet light, the damage to the device layer 9 due to the uncured resin R and further, the deterioration of characteristics of the device layer 9 can be suppressed.

The resin applying device 10 of the present embodiment further includes the expanding portion 12. In this case, the expanding portion 12 can be used to divide the workpiece into the chips 1a and to form the gap G. In the resin applying device 10, the expanding portion 12 may also serve as the table 14, or may be provided with another table different from the table 14.

In the present embodiment, when the expanding tape 6 is weakly in close contact with the table 14 due to static electricity or the like, for example, vibration occurs when the chip 1a is taken out. Therefore, for example, the vibration may be suppressed by providing an embossed part on a placement surface of the table 14 or providing an antistatic part with an ionizer or the like.

Although the embodiment according to one aspect of the present invention has been described above, one aspect of the present invention is not limited to the above embodiment, and may be modified within the scope not changing the gist described in each claim, or may be applied to other things.

In the above embodiment, as shown in FIG. 14(a), the expanding tape 6 may be pasted on the front surface 3 of the workpiece 1 on the device layer 9 side. This can prevent the deterioration of the characteristics of the device layer 9.

In the above embodiment, as shown in FIG. 14(b), the expanding tape 6 may be pasted on the back surface 4 of the workpiece 1 on the opposite side to the device layer 9 side, and in the step of filling the resin R, a protective sheet HG may be pasted on the front surface 3 of the workpiece 1 on the device layer 9 side before the resin R is applied. This can prevent the deterioration of the characteristics of the device layer 9.

In the above embodiment, in the first step, the protective sheet HG may be pasted on the front surface 3 of the workpiece 1 on the device layer 9 side. In this case, the expanding tape 6 is attached to the back surface 4 of the workpiece 1. The protective sheet HG may be reattached after the expanding tape 6 is expanded in the second step. Even in this case, the deterioration of the characteristics of the device layer 9 can also be prevented.

Incidentally, the protective sheet HG is not particularly limited, and various sheets such as a sheet that does not expand can be used. Instead of the protective sheet HG, for example, a non-expanding protective tape such as a back grinding tape may be used. The protective tape is not particularly limited, and various tapes can be used.

Figure 15:
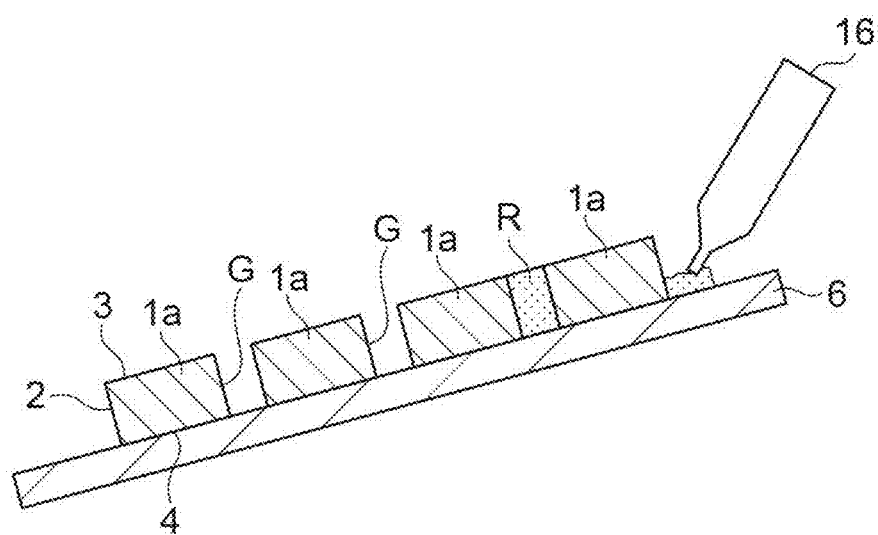
FIG. 15 is a schematic cross-sectional view showing another example in a case where a gap of the workpiece is filled with the resin.
Figure 16:
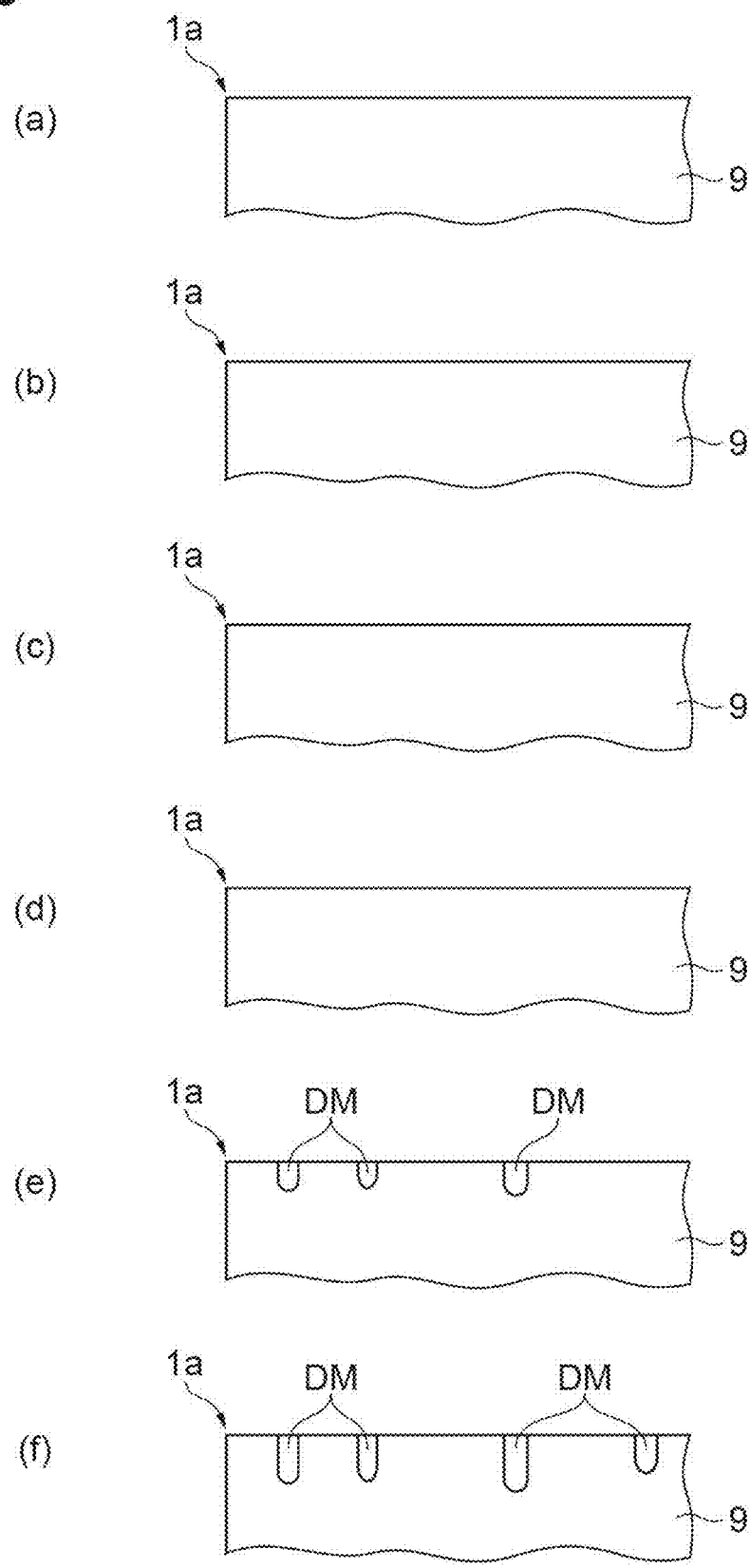
FIG. 16(a) is an enlarged plan view showing a part of a chip on the device layer side in a state after the resin is applied and the gap is filled with the resin and before the resin is cured.
FIG. 16(b) is an enlarged plan view showing a state after a predetermined time has elapsed from FIG. 16(a).
FIG. 16(c) is an enlarged plan view showing a state after a predetermined time has elapsed from FIG. 16(b).
FIG. 16(d) is an enlarged plan view showing a state after a predetermined time has elapsed from FIG. 16(c).
FIG. 16(e) is an enlarged plan view showing a state after a predetermined time has elapsed from FIG. 16(d).
FIG. 16(f) is an enlarged plan view showing a state after a predetermined time has elapsed from FIG. 16(e).

As shown in FIG. 15, in the workpiece cutting method, the gap G is filled with the resin in a state where the workpiece 1 is placed on the table 14, and the table 14 may be inclined to make a position where the resin R is applied on the table 14 be higher than the workpiece 1. By inclining the table 14 on which the workpiece 1 is placed in this manner, the time until the filling between the plurality of chips 1a with the resin R is completed can be further shortened. The inclination of the table 14 is particularly effective when the resin R is applied from one side (single side) in the direction along the front surface 3 of the workpiece 1, not when the resin R is applied along the entire periphery of the workpiece 1. Here, the table 14 has a configuration in which the table 14 is inclined. The configuration for inclining the table 14 is not particularly limited, and a known configuration can be used.

In the filling of the resin R of the above embodiment, the resin R may be applied to at least a part of the outer edge part including the side surface 2 of the workpiece 1 to fill the gap G with the resin R from the outer edge part, instead of or in addition to applying the resin R to the periphery separated from the side surface 2 of the workpiece 1 by a predetermined length. The outer edge part may be a bevel region on the outer periphery of the workpiece 1. Also in this case, the filling of the gap G with the resin R can be effectively realized.

In the above embodiment, the irradiation of the expanding tape 6 with the ultraviolet light may be performed at any timing as long as the timing is before the application of the resin R. In the above embodiment, after the expanding tape 6 is irradiated with the ultraviolet light, the gap G may be filled with the applied resin R from the side surface 2 of the workpiece 1 while the gap G is formed (grown) by expansion of the expanding tape 6.

In the above embodiment, the resin applying portion 16 is not limited to the dispenser, and various kinds of application means may be used. The resin applying portion 16 may be, for example, a mechanism that applies the resin R by an inkjet method, a mechanism that applies the resin R by screen printing, or the like. In the case where the mechanism that applies the resin R by screen printing is used for the resin applying portion 16, the resin R can be applied circumferentially along the outer edge of the workpiece 1 in a short time.

In the above embodiment, the ultraviolet curing resin utilizing ultraviolet curing is used for the resin R, but the resin R is not particularly limited. For example, the resin R may be a resin using a curing reaction using external energy such as thermal curing or a resin using room-temperature reaction curing.

In the above embodiment, at least a part of the cured resin R may be removed before the chip 1a is taken out. In this case, the particles remaining on the cut surface of the chip 1a can be removed together with the resin R before the chip 1a is taken out.

In the above embodiment, the expanding tape 6 is used as the expandable sheet in order to divide the workpiece 1 into the chips 1a. However, the expandable sheet is not limited to the expanding tape 6, and various expandable sheet materials or tape materials may be used. At the time of expanding, for example, a knife edge, a breaker device, a roller device, or the like may be further used. In the above description, "curing" also includes a mode in which the resin composition is not completely solidified. The curing is only required to solidify at least a part of the liquid resin R, and the resin R shrinks by curing. The cured resin R may contain at least one of a gaseous (gas) resin R and a resin R remaining in a liquid state.

In the above embodiment, the resin R may be applied by the resin applying portion 16 in a state where the workpiece 1 is placed on a table different from the table 14 on which the workpiece 1 is placed when the ultraviolet irradiating portion 18 irradiates with the ultraviolet light. That is, the configuration may be adopted in which the workpiece 1 is placed on different tables at the time of applying the resin R and at the time of irradiating with the ultraviolet light. In this case, the workpiece 1 after the resin R is applied may be conveyed to the table of the ultraviolet irradiating portion 18 so as not to generate vibration, for example, by conveying the workpiece 1 in the horizontal direction.

REFERENCE SIGNS LIST 1 workpiece
1a chip
2 side surface
3 front surface (upper surface)
4 back surface
5 line to cut
6 expanding tape (expandable sheet)
7 modified region
9 device layer
10 resin applying device
12 expanding portion
14 table
16 resin applying portion
18 ultraviolet irradiating portion
G gap
HG protective sheet
L laser light
R resin

The invention claimed is:

1. A workpiece cutting method comprising:
a first step of pasting an expandable sheet that cures by being irradiated with ultraviolet light on a front surface or a back surface of a workpiece;
a second step of irradiating, after the first step, the workpiece with laser light along a line to cut to form a modified region and expanding the expandable sheet to divide at least a part of the workpiece into a plurality of chips, and meanwhile, to form a gap disposed between the plurality of chips and extending to a side surface of the workpiece;
a third step of curing the expandable sheet by irradiating the expandable sheet with ultraviolet light after the first step;
a fourth step of filling, after the second step and the third step, the gap with resin from an outer edge part of the workpiece including the side surface;
a fifth step of curing the resin after the fourth step; and
a sixth step of taking out the plurality of chips from above the expandable sheet after the fifth step,
wherein, in the third step, ultraviolet light is irradiated from a back surface side of the expandable sheet to improve wettability of a portion facing the gap in the expandable sheet and reduce an adhesive force of the expandable sheet to the workpiece, and
wherein, in the fifth step, the resin filled in the gap is cured by irradiating the resin with ultraviolet light from the back surface side of the expandable sheet.

2. The workpiece cutting method according to claim 1, wherein
in the fourth step,
the gap is filled with the resin in a state where the workpiece is placed on a table, and
the resin is filled by an amount that allows a liquid level of the resin to be located below an upper surface of the workpiece and above the modified region closest to the upper surface.

3. The workpiece cutting method according to claim 1, wherein, in the first step, the workpiece is pasted with the expandable sheet, a protective sheet, or a protective tape on one of the front surface and the back surface located closer to a device layer, the front surface and the back surface being of the workpiece.

4. The workpiece cutting method according to claim 1, wherein
in the first step, the workpiece is pasted with the expandable sheet on one of the front surface and the back surface located opposite a device layer, the front surface and the back surface being of the workpiece, and
in the fourth step, before the resin is applied, a protective sheet or a protective tape is pasted on the other of the front surface and the back surface closer to the device layer, the front surface and the back surface being of the workpiece.

5. The workpiece cutting method according to claim 1, wherein, in the second step, the expandable sheet is expanded to allow the gap to be 10 μm to 300 μm.

6. A workpiece cutting method comprising:
a first step of pasting an expandable sheet on a front surface or a back surface of a workpiece;
a second step of irradiating, after the first step, the workpiece with laser light along a line to cut to form a modified region and expanding the expandable sheet to divide at least a part of the workpiece into a plurality of chips, and meanwhile, to form a gap disposed between the plurality of chips and extending to a side surface of the workpiece;
a third step of irradiating the expandable sheet with ultraviolet light after the first step;
a fourth step of filling, after the second step and the third step, the gap with resin from an outer edge part of the workpiece including the side surface;
a fifth step of curing the resin after the fourth step; and
a sixth step of taking out the plurality of chips from above the expandable sheet after the fifth step, wherein
in the fourth step,
the gap is filled with the resin in a state where the workpiece is placed on a table, and
the table is inclined to make a position where the resin is applied on the table be higher than the workpiece.

7. The workpiece cutting method according to claim 6, wherein
in the fourth step,
the resin is filled by an amount that allows a liquid level of the resin to be located below an upper surface of the workpiece and above the modified region closest to the upper surface.

8. The workpiece cutting method according to claim 6, wherein, in the first step, the workpiece is pasted with the expandable sheet, a protective sheet, or a protective tape on one of the front surface and the back surface located closer to a device layer, the front surface and the back surface being of the workpiece.

9. The workpiece cutting method according to claim 6, wherein
in the first step, the workpiece is pasted with the expandable sheet on one of the front surface and the back surface located opposite a device layer, the front surface and the back surface being of the workpiece, and
in the fourth step, before the resin is applied, a protective sheet or a protective tape is pasted on the other of the front surface and the back surface closer to the device layer, the front surface and the back surface being of the workpiece.

10. The workpiece cutting method according to claim 6, wherein, in the second step, the expandable sheet is expanded to allow the gap to be 10 μm to 300 μm.

11. A workpiece cutting method comprising:
a first step of pasting an expandable sheet on a front surface or a back surface of a workpiece;
a second step of irradiating, after the first step, the workpiece with laser light along a line to cut to form a modified region and expanding the expandable sheet to divide at least a part of the workpiece into a plurality of chips, and meanwhile, to form a gap disposed between the plurality of chips and extending to a side surface of the workpiece;
a third step of irradiating the expandable sheet with ultraviolet light after the first step;
a fourth step of filling, after the second step and the third step, the gap with resin from an outer edge part of the workpiece including the side surface;
a fifth step of curing the resin after the fourth step; and
a sixth step of taking out the plurality of chips from above the expandable sheet after the fifth step, wherein, in the fifth step, the resin filled in the gap of the workpiece is cured in a state where the workpiece is placed on a table and by irradiating the resin with the ultraviolet light from below.

12. The workpiece cutting method according to claim 11, wherein
in the fourth step,
the gap is filled with the resin in a state where the workpiece is placed on the table, and
the resin is filled by an amount that allows a liquid level of the resin to be located below an upper surface of the workpiece and above the modified region closest to the upper surface.

13. The workpiece cutting method according to claim 11, wherein, in the first step, the workpiece is pasted with the expandable sheet, a protective sheet, or a protective tape on one of the front surface and the back surface located closer to a device layer, the front surface and the back surface being of the workpiece.

14. The workpiece cutting method according to claim 11, wherein
in the first step, the workpiece is pasted with the expandable sheet on one of the front surface and the back surface located opposite a device layer, the front surface and the back surface being of the workpiece, and
in the fourth step, before the resin is applied, a protective sheet or a protective tape is pasted on the other of the front surface and the back surface closer to the device layer, the front surface and the back surface being of the workpiece.

15. The workpiece cutting method according to claim 11, wherein, in the second step, the expandable sheet is expanded to allow the gap to be 10 μm to 300 μm.

* * * * *